United States Patent
Kim et al.

(10) Patent No.: US 12,272,666 B2
(45) Date of Patent: Apr. 8, 2025

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Eunsil Kim, Cheonan-si (KR); Seunghan Sim, Incheon (KR); Gun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 452 days.

(21) Appl. No.: 17/745,612

(22) Filed: May 16, 2022

(65) Prior Publication Data

US 2023/0045383 A1    Feb. 9, 2023

(30) Foreign Application Priority Data

Aug. 4, 2021 (KR) .................. 10-2021-0102667

(51) Int. Cl.
   *H01L 23/00*    (2006.01)
(52) U.S. Cl.
   CPC .............. *H01L 24/20* (2013.01); *H01L 24/19* (2013.01); *H01L 2224/2101* (2013.01); *H01L 2224/2105* (2013.01); *H01L 2224/211* (2013.01); *H01L 2224/214* (2013.01)
(58) Field of Classification Search
   CPC . H01L 24/20; H01L 24/19; H01L 2224/2101; H01L 2224/2105; H01L 2224/211; H01L 2224/214
   See application file for complete search history.

(56) References Cited

U.S. PATENT DOCUMENTS

| | | |
|---|---|---|
| 7,538,039 B2 | 5/2009 | Sasagawa et al. |
| 8,760,882 B2 | 6/2014 | Chang et al. |
| 9,040,359 B2 | 5/2015 | Gregorich et al. |
| 9,082,870 B2 | 7/2015 | Lu et al. |
| 9,583,462 B2 | 2/2017 | Lee et al. |
| 10,026,695 B2 | 7/2018 | Kageyama |
| 10,153,240 B2 | 12/2018 | Lu et al. |
| 10,276,480 B1 | 4/2019 | Lu |
| 10,515,915 B2 | 12/2019 | Chang et al. |
| 10,692,805 B2 | 6/2020 | Kim |
| 2002/0050649 A1 | 5/2002 | Ahn |

(Continued)

FOREIGN PATENT DOCUMENTS

| | | |
|---|---|---|
| JP | 2006-210406 | 8/2006 |
| JP | 2013-026367 | 2/2013 |
| KR | 10-2010-0050303 | 5/2010 |

*Primary Examiner* — Monica D Harrison
*Assistant Examiner* — Andre C Stevenson
(74) *Attorney, Agent, or Firm* — Fish & Richardson P.C.

(57) ABSTRACT

A method of manufacturing a semiconductor package includes forming an insulating layer; forming a seed layer on the insulating layer; forming a photoresist layer on the seed layer; forming a plurality of line pattern holes by patterning the photoresist layer, a horizontal length of a middle portion of each of the plurality of line pattern holes being less than a horizontal length of an upper portion of each of the plurality of line pattern holes and a horizontal length of a lower portion of each of the plurality of line pattern holes; and forming a redistribution line pattern by performing a plating process using a portion of the seed layer exposed by the plurality of line pattern holes.

10 Claims, 13 Drawing Sheets

(56) References Cited

U.S. PATENT DOCUMENTS

| | | | |
|---|---|---|---|
| 2005/0269206 A1 | 12/2005 | Tanaka et al. | |
| 2013/0295725 A1* | 11/2013 | Park | H01L 21/568 |
| | | | 257/E21.502 |
| 2014/0264824 A1 | 9/2014 | Lu et al. | |
| 2015/0262948 A1 | 9/2015 | Lu et al. | |
| 2017/0040269 A1 | 2/2017 | Lu et al. | |
| 2017/0309523 A1* | 10/2017 | Sohn | H01L 23/3128 |
| 2022/0399315 A1* | 12/2022 | Jang | H01L 21/561 |

* cited by examiner

SEMICONDUCTOR PACKAGE AND METHOD OF MANUFACTURING THE SAME

CROSS-REFERENCE TO RELATED APPLICATION

A claim of priority under 35 U.S.C. § 119 is made to Korean Patent Application No. 10-2021-0102667, filed on Aug. 4, 2021, in the Korean Intellectual Property Office, the entirety of which is hereby incorporated by reference.

BACKGROUND

The present disclosure relates to semiconductor packages and methods of manufacturing the same.

With the increase in storage capacity of semiconductor chips, semiconductor packages including a semiconductor chip are required to be thin and light. There has recently been interest in including semiconductor chips having various functions in a semiconductor package while providing the capability of driving the semiconductor chips quickly and efficiently. Consequently, the placement of redistribution patterns connected to semiconductor chips has become increasingly complex, and the size of and the distance between the redistribution patterns have been decreasing.

SUMMARY

Embodiments of the inventive concepts provide a semiconductor package with increased structural reliability and improved electromigration.

Embodiments of the inventive concepts also provide a method of manufacturing a semiconductor package including a redistribution pattern with increased structural reliability.

Embodiments of the inventive concepts provide a method of manufacturing a semiconductor package that includes forming an insulating layer on a semiconductor chip; forming a via pattern hole in the insulating layer by etching at least a portion of the insulating layer, the via pattern hole exposing at least a portion of the semiconductor chip; forming a seed layer on the insulating layer and on the portion of the semiconductor chip exposed in the via pattern hole; forming a photoresist layer on the seed layer; exposing the photoresist layer such that an amount of hardening of a middle portion of the photoresist layer is greater than an amount of hardening of an upper portion of the photoresist layer and an amount of hardening of a lower portion of the photoresist layer; forming a photoresist pattern having a plurality of line pattern holes by developing the photoresist layer; and forming a redistribution pattern by filling the via pattern hole of the insulating layer and the plurality of line pattern holes of the photoresist pattern.

Embodiments of the inventive concept further provide a method of manufacturing a semiconductor package that includes forming an insulating layer; forming a seed layer on the insulating layer; forming a photoresist layer on the seed layer; forming a plurality of line pattern holes by patterning the photoresist layer, a horizontal length of a middle portion of each of the plurality of line pattern holes being less than a horizontal length of an upper portion of each of the plurality of line pattern holes and a horizontal length of a lower portion of each of the plurality of line pattern holes; and forming a redistribution line pattern by performing a plating process using a portion of the seed layer exposed by the plurality of line pattern holes.

Embodiments of the inventive concepts still further provide a semiconductor package including a semiconductor chip; an insulating layer on the semiconductor chip; and a redistribution pattern extending in the insulating layer and connected to the semiconductor chip, the redistribution pattern including a plurality of redistribution via patterns and a plurality of redistribution line patterns, the plurality of redistribution via patterns vertically extending in the insulating layer, and the plurality of redistribution line patterns horizontally extending in the insulating layer. A cross-section of each of the plurality of redistribution line patterns includes a lower portion having a horizontal length that increases approaching towards the semiconductor chip, a middle portion on the lower portion and having a side wall that is concave towards a center of the plurality of redistribution line patterns, and an upper portion on the middle portion and having an upper surface that is convex.

According to embodiments of the inventive concepts, a lower portion of a redistribution line pattern of a semiconductor package may have a structure having a horizontal length increasing downwards, and accordingly, a contact area between the redistribution line pattern and an insulating layer may increase. As a result, the adhesion between the redistribution line pattern and the insulating layer may be enhanced, and delamination between the redistribution line pattern and the insulating layer may be decreased. In other words, the structural reliability of the redistribution line pattern may be increased.

According to embodiments of the inventive concepts, because a middle portion of the redistribution line pattern may have a side wall that is concave towards the center of the redistribution line pattern, stress applied to the redistribution line pattern may be dispersed, and accordingly, the structural reliability of the redistribution line pattern may be increased.

According to embodiments of the inventive concepts, because an upper portion of the redistribution line pattern may have an upper surface that is convex upwards, a contact area between the upper portion and the insulating layer may increase.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
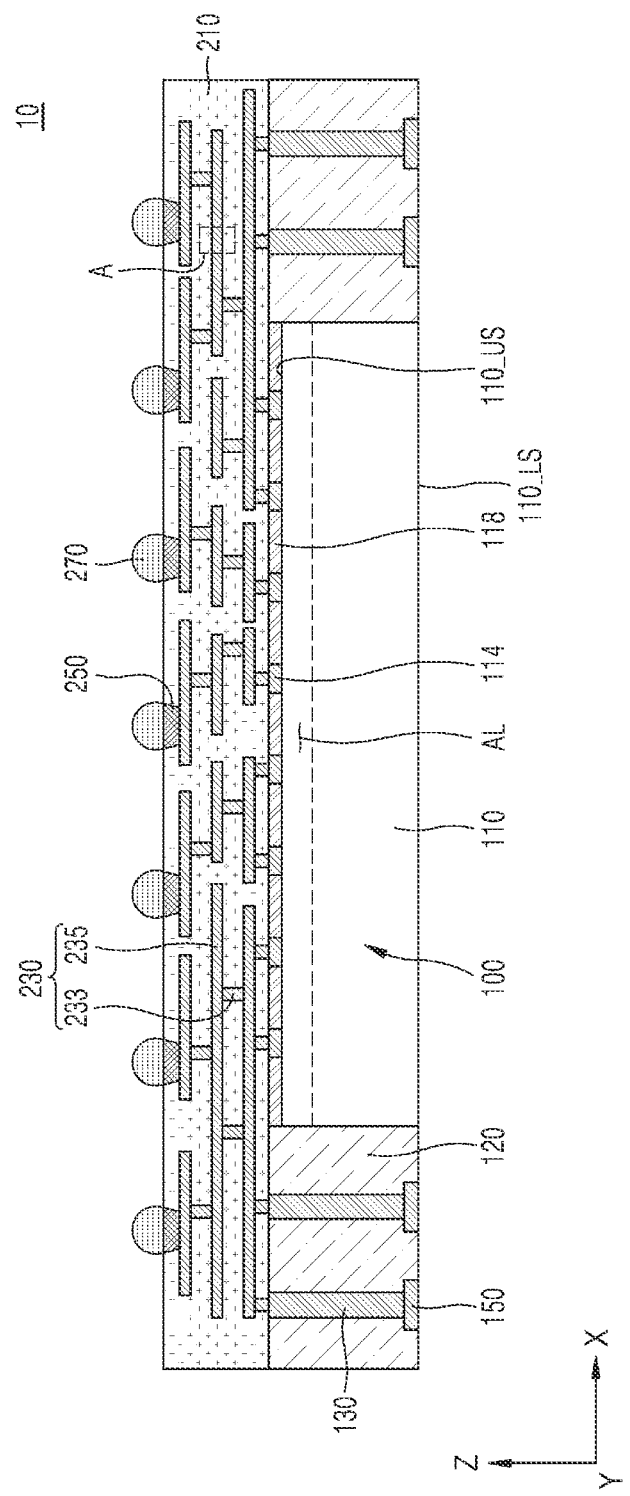
FIG. 1 illustrates a cross-sectional view of a semiconductor package according to embodiments of the inventive concepts.

Hereinafter, embodiments are described in detail with reference to the accompanying drawings. Herein, like reference numerals will denote like elements, and redundant descriptions thereof will be omitted for conciseness. Throughout the description, relative locations of components may be described using terms such as "vertical", "horizontal", "over", "higher" and so on. These terms are for descriptive purposes only, and are intended only to describe the relative locations of components assuming the orientation of the overall device is the same as that shown in the drawings. The embodiments however are not limited to the illustrated device orientations.

Figure 2:
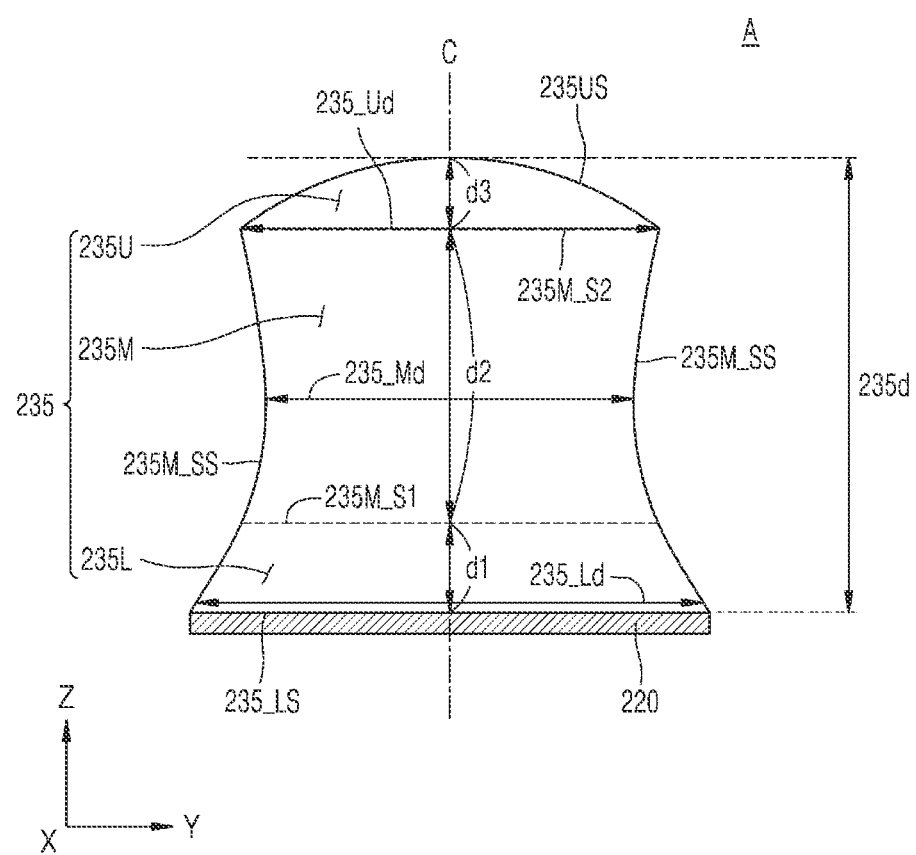
FIG. 2 illustrates a cross-sectional view of a redistribution line pattern in region A of FIG. 1.

FIG. 1 illustrates a cross-sectional view of a semiconductor package 10 according to embodiments of the inventive concepts. FIG. 2 illustrates a cross-sectional view of a redistribution line pattern 235 according to embodiments of the inventive concepts.

Referring to FIGS. 1 and 2, the semiconductor package 10 may include a semiconductor chip 100, a molding layer 120, a conductive pillar 130, a pillar connection pad 150, an insulating layer 210, a seed layer 220, a redistribution pattern 230, a package connection pad 250, and a package connection terminal 270.

In an example embodiment, the semiconductor chip 100 may include a logic semiconductor chip. The semiconductor chip 100 may include a logic semiconductor chip, such as for example, a central processor unit (CPU), a microprocessor unit (MPU), a graphics processor unit (GPU), an application processor (AP) or the like.

However, embodiments are not limited thereto, and in other embodiments the semiconductor chip 100 may include a memory semiconductor chip. For example, the semiconductor chip 100 may include a volatile memory semiconductor chip including for example dynamic random access memory (DRAM) or static RAM (SRAM), or a non-volatile memory semiconductor chip including for example phase-change RAM (PRAM), magneto-resistive RAM (MRAM), ferroelectric RAM (FeRAM), or resistive RAM (RRAM).

The semiconductor chip 100 may include a semiconductor substrate 110 having an active layer AL, a chip pad 114, and a passivation layer 118.

The semiconductor substrate 110 may include silicon (Si). The semiconductor substrate 110 may include a semiconductor element, e.g., germanium (Ge), or a compound semiconductor such as for example silicon carbide (SiC), gallium arsenide (GaAs), indium arsenide (InAs), or indium phosphide (InP).

The semiconductor substrate 110 may have an upper surface 110_US, which is adjacent to the insulating layer 210, and a lower surface 110_LS opposite the upper surface 110_US. The semiconductor substrate 110 may have the active layer AL in a portion adjacent to the upper surface 110_US of the semiconductor substrate 110. In other words, the semiconductor substrate 110 may have the active layer AL in a portion adjacent to the insulating layer 210.

The active layer AL may include various kinds of individual devices. For example, the individual devices may include various microelectronic devices, e.g., complementary metal-oxide-semiconductor (CMOS) transistors, metal-oxide-semiconductor field effect transistors (MOSFETs), system large scale integration (LSI), image sensors such as CMOS image sensors (CIS), micro-electro-mechanical systems (MEMS), active elements, and passive elements.

The chip pad 114 may be on the upper surface 110_US of the semiconductor substrate 110 and electrically connected to the individual devices of the active layer AL. In an example embodiment, the chip pad 114 may include at least one material selected from aluminum (Al), copper (Cu), silver (Ag), tin (Sn), and gold (Au).

In an example embodiment, an upper surface of the chip pad 114 may be in contact with a redistribution via pattern 233 of the redistribution pattern 230. A lower surface of the chip pad 114 may be in contact with the upper surface 110_US of the semiconductor substrate 110.

The passivation layer 118 may be on the upper surface 110_US of the semiconductor substrate 110 and may surround the chip pad 114. In an example embodiment, the material of the passivation layer 118 may include silicon oxynitride (SiON), silicon oxide ($SiO_2$), silicon oxycarbonitride (SiOCN), silicon carbonitride (SiCN), or a combination thereof.

In an example embodiment, an upper surface of the passivation layer 118 may be coplanar with the upper surface of the chip pad 114. In other words, the upper surface of the passivation layer 118 may expose the upper surface of the chip pad 114.

The molding layer 120 may surround the side of the semiconductor chip 100. In an example embodiment, the material of the molding layer 120 may include an epoxy molding compound (EMC). However, the material of the molding layer 120 is not limited thereto.

In an example embodiment, an upper surface of the molding layer 120 may be in contact with a lower surface of the insulating layer 210. A lower surface of the molding layer 120 may be coplanar with the lower surface 110_LS of the semiconductor substrate 110.

The conductive pillar 130 may be at an outer side of the semiconductor chip 100 and may pass through the molding layer 120 in a vertical direction (e.g., the Z direction). Hereinafter, the vertical direction may be defined as being perpendicular to a direction in which the upper and lower surfaces 110_US and 110_LS of the semiconductor substrate 110 extend, and a horizontal direction (e.g., the X direction)

may be defined as being parallel with the direction in which the upper and lower surfaces 110_US and 110_LS of the semiconductor substrate 110 extend.

In an example embodiment, according to a top view of the semiconductor package 10, the conductive pillar(s) 130 may be around the edge of the semiconductor chip 100. The material of the conductive pillar 130 may include for example at least one selected from Cu, Sn, Ag, and Al. For example, the material of the conductive pillar 130 may include Cu.

In an example embodiment, an upper surface of the conductive pillar 130 may be connected to the redistribution via pattern 233 of the redistribution pattern 230, and a lower surface of the conductive pillar 130 may be connected to the pillar connection pad 150.

The pillar connection pad 150 may include a conductive material and may be attached to the lower surface of the conductive pillar 130. In an example embodiment, the material of the pillar connection pad 150 may include for example at least one selected from Al, Cu, Ag, Sn, and Au.

In an example embodiment, the pillar connection pad 150 may electrically connect another semiconductor package (not shown), which is mounted on the molding layer 120 of the semiconductor package 10, to the redistribution pattern 230. In other words, another semiconductor package mounted on the molding layer 120 may be electrically connected to the redistribution pattern 230 through the pillar connection pad 150 and the conductive pillar 130.

In an example embodiment, the pillar connection pad 150 may be surrounded by the molding layer 120. A lower surface of the pillar connection pad 150 may be coplanar with and exposed from the lower surface of the molding layer 120.

However, embodiments are not limited thereto, and in other embodiments the pillar connection pad 150 may be attached to the lower surface of the molding layer 120 and protrude therefrom.

The insulating layer 210 may be on the upper surfaces of the semiconductor chip 100 and the molding layer 120, and may surround the redistribution pattern 230. In an example embodiment, the insulating layer 210 may include oxide or nitride. For example, the insulating layer 210 may include silicon oxide or silicon nitride. The insulating layer 210 may include a photo-imageable dielectric (PID) material on which a photolithography process may be performed. For example, the insulating layer 210 may include photosensitive polyimide (PSPI).

The redistribution pattern 230 may extend in the insulating layer 210 and connect the conductive pillar 130 to the package connection pad 250, the semiconductor chip 100 to the package connection pad 250, or the semiconductor chip 100 to the conductive pillar 130.

In an example embodiment, the material of the redistribution pattern 230 may include Cu. However, embodiments are not limited thereto, and in other embodiments the material of the redistribution pattern 230 may include metal such as for example nickel (Ni), Au, Ag, Al, tungsten (W), titanium (Ti), tantalum (Ta), indium (In), molybdenum (Mo), manganese (Mn), cobalt (Co), Sn, magnesium (Mg), rhenium (Re), beryllium (Be), gallium (Ga), or ruthenium (Ru), or an alloy thereof.

The redistribution pattern 230 may include the redistribution via pattern 233 which extends in the vertical direction in the insulating layer 210, and the redistribution line pattern 235 which extends in the horizontal direction in the insulating layer 210.

In an example embodiment, the redistribution via pattern 233 may connect a plurality of redistribution line patterns 235 to each other in the insulating layer 210, or connect a redistribution line pattern 235 to the conductive pillar 130 or the chip pad 114 of the semiconductor chip 100.

A plurality of redistribution line patterns 235 may form a plurality of layers in the insulating layer 210. For example, the redistribution line patterns 235 may form three layers in the vertical direction in FIG. 1. However, the number of layers of the redistribution line patterns 235 is not limited thereto.

The structure and shape of a redistribution line pattern 235 are described in detail with reference to FIG. 2 hereinafter.

The seed layer 220 may be between the insulating layer 210 and the redistribution pattern 230. In detail, the seed layer 220 may be between the insulating layer 210 and the redistribution via pattern 233 as should be understood in view of FIG. 1 for example, and between the insulating layer 210 and the redistribution line pattern 235. The seed layer 220 may be between the redistribution via pattern 233 and the conductive pillar 130, and between the redistribution via pattern 233 and the chip pad 114.

In an example embodiment, the seed layer 220 may be formed on the insulating layer 210 using physical vapor deposition, and the redistribution via pattern 233 and the redistribution line pattern 235 may be formed on the insulating layer 210 by performing a plating process using the seed layer 220.

In an example embodiment, the material of the seed layer 220 may include Ti, titanium tungsten (TiW), titanium nitride (TiN), Ta, tantalum nitride (TaN), chrome (Cr), Al, or a combination thereof. For example, the seed layer 220 may have a structure in which Cu is stacked on Ti, or a structure in which Cu is stacked on TiW. However, the material of the seed layer 220 is not limited to the above mentioned materials.

The package connection pad 250 may include a conductive material and connect the package connection terminal 270 to the redistribution pattern 230. An upper surface of the package connection pad 250 may be exposed from an upper surface of the insulating layer 210 and be in contact with the package connection terminal 270.

In an example embodiment, the material of the package connection pad 250 may include for example at least one selected from Al, Cu, Ag, Sn, and Au.

The package connection terminal 270 may be mounted on the package connection pad 250 and configured to electrically connect the semiconductor package 10 to an external device. For example, the package connection terminal 270 may include a metal solder ball including at least one selected from Sn, Ag, Cu, and Al.

Hereinafter, the shape of the redistribution line pattern 235 is described in detail with reference to FIG. 2.

FIG. 2 may be a cross-sectional view of the redistribution line pattern 235 in the region A in FIG. 1. In detail, FIG. 2 may be a cross-sectional view of the redistribution line pattern 235 in the region A in FIG. 1 along a Y-Z plane.

The redistribution line pattern 235 may include a lower portion 235L, a middle portion 235M, and an upper portion 235U. Hereinafter, the lower portion 235L of the redistribution line pattern 235 may be a portion of the redistribution line pattern 235 that is close to (or faces) the semiconductor chip 100. The upper portion 235U of the redistribution line pattern 235 may be a portion of the redistribution line pattern 235 that is close to (or faces) the package connection terminal 270.

A height 235d of the redistribution line pattern 235 may be defined as the length of the redistribution line pattern 235 in the vertical direction (e.g., the Z direction). In an example embodiment, the height 235d of the redistribution line pattern 235 may be about 3 micrometers to about 5 micrometers.

The lower portion 235L of the redistribution line pattern 235 may span a first distance d1 from a lower surface 235_LS of the redistribution line pattern 235. In other words, the first distance d1 may correspond to the height of the lower portion 235L of the redistribution line pattern 235 as measured from the top surface of the seed layer 220.

In an example embodiment, the first distance d1 may be about 20% to about 40% of the height 235d of the redistribution line pattern 235. For example, the first distance may be about ⅓ of the height 235d of the redistribution line pattern 235.

For example, when the height 235d of the redistribution line pattern 235 is about 4.2 micrometers, the height of the lower portion 235L of the redistribution line pattern 235 (i.e., the first distance d1) may be about 1.4 micrometers. However, the height of the lower portion 235L is not limited to above mentioned height.

The lower portion 235L of the redistribution line pattern 235 may have a structure having a length in the horizontal direction (e.g., the Y direction) increasing downwards (i.e., toward the seed layer 220). For example, the lower portion 235L of the redistribution line pattern 235 may have a tapered shape having an X-Y plane cross-sectional area increasing downwards.

A longest length 235_Ld of the lower portion 235L of the redistribution line pattern 235 may be defined as the greatest length among the lengths of the lower portion 235L in the horizontal direction (e.g., the Y direction). Accordingly, the longest length 235_Ld of the lower portion 235L of the redistribution line pattern 235 may correspond to the length of the lower surface 235_LS of the redistribution line pattern 235 in the horizontal direction (e.g., the Y direction).

In an example embodiment, the longest length 235_Ld of the lower portion 235L of the redistribution line pattern 235 may be the greatest among the lengths in the horizontal direction (e.g., the Y direction) of the lower portion 235L, the middle portion 235M, and the upper portion 235U of the redistribution line pattern 235.

In an example embodiment, the longest length 235_Ld of the lower portion 235L of the redistribution line pattern 235 may be about 2 micrometers to about 10 micrometers. However, the longest length 235_Ld of the lower portion 235L of the redistribution line pattern 235 is not limited to the above mentioned lengths.

In an example embodiment, the middle portion 235M of the redistribution line pattern 235 may span a second distance d2 from the top of the lower portion 235L of the redistribution line pattern 235. In other words, the second distance d2 may correspond to the height of the middle portion 235M of the redistribution line pattern 235 as measured from the top of the lower portion 235L.

The middle portion 235M of the redistribution line pattern 235 may connect the upper and lower portions 235U and 235L of the redistribution line pattern 235 to each other. A first virtual interface 235M_S1 may be between the middle portion 235M and the lower portion 235L of the redistribution line pattern 235, and a second virtual interface 235M_S2 may be between the middle portion 235M and the upper portion 235U of the redistribution line pattern 235. In other words, the middle portion 235M of the redistribution line pattern 235 may be between the first virtual interface 235M_S1 and the second virtual interface 235M_S2.

The middle portion 235M of the redistribution line pattern 235 may have a structure having a length in the horizontal direction (e.g., the Y direction) decreasing and then increasing downwards (i.e., towards the seed layer 220). In other words, the middle portion 235M of the redistribution line pattern 235 may have a structure having a horizontal length decreasing and then increasing from the second virtual interface 235M_S2 toward the first virtual interface 235M_S1. For example, the middle portion 235M may have a structure having an X-Y plane cross-section area decreasing and then increasing downwards (e.g., the —Z direction).

In an example embodiment, a side wall 235M_SS of the middle portion 235M of the redistribution line pattern 235 may have a shape that is concave towards a virtual centerline C passing through the center of the redistribution line pattern 235 in the vertical direction (e.g., the Z direction).

In an example embodiment, a shortest length 235_Md of the middle portion 235M of the redistribution line pattern 235 may be defined as the least (i.e., smallest) length among the lengths in the horizontal direction (e.g., the Y direction) of the middle portion 235M.

In an example embodiment, the shortest length 235_Md of the middle portion 235M of the redistribution line pattern 235 may have the least (i.e., smallest) value among the lengths in the horizontal direction (e.g., the Y direction) of the lower portion 235L, the middle portion 235M, and the upper portion 235U of the redistribution line pattern 235.

In an example embodiment, the shortest length 235_Md of the middle portion 235M of the redistribution line pattern 235 may be in a range from about 0.4 micrometers to about 2 micrometers, and less than the longest length 235_Ld of the lower portion 235L.

The upper portion 235U of the redistribution line pattern 235 may span a third distance d3 from the middle portion 235M of the redistribution line pattern 235. In other words, the third distance d3 may correspond to a height of the upper portion 235U of the redistribution line pattern 235 as measured from the top of the middle portion 235M.

In an example embodiment, the third distance d3 may be about 20% to about 40% of the height 235d of the redistribution line pattern 235. For example, the third distance d3 may be about ⅓ of the height 235d of the redistribution line pattern 235.

For example, when the height 235d of the redistribution line pattern 235 is about 4.2 micrometers, the height of the upper portion 235U of the redistribution line pattern 235 (i.e., the third distance d3) may be about 1.4 micrometers. However, the height of the upper portion 235U of the redistribution line pattern 235 is not limited to above mentioned heights.

The upper portion 235U of the redistribution line pattern 235 may have a structure having a length in the horizontal direction (e.g., the Y direction) decreasing upwards (i.e., away from the seed layer 220).

In an example embodiment, a longest length 235_Ud of the upper portion 235U of the redistribution line pattern 235 may be defined as the greatest length among the lengths in the horizontal direction (e.g., the Y direction) of the upper portion 235U. The longest length 235_Ud of the upper portion 235U of the redistribution line pattern 235 may be greater than the shortest length 235_Md of the middle portion 235M of the redistribution line pattern 235.

In an example embodiment, an upper surface 235_US of the redistribution line pattern 235 may be rounded. In detail, the upper portion 235U of the redistribution line pattern 235 may have the upper surface 235_US that is convex upwards. For example, the upper surface 235_US of the redistribution line pattern 235 may have a concave-convex structure (not shown) in which concavities and convexities are repeated.

In an example embodiment, a centerline average height roughness (Ra), or in other words the arithmetic average roughness height (AARH), of the upper surface 235_US of the redistribution line pattern 235 may be about 0.03 micrometers to about 0.09 micrometers. For example, the centerline average height roughness of the upper surface 235_US of the redistribution line pattern 235 may be about 0.05 millimeters.

In a state in which a curve of the upper surface 235_US of the redistribution line pattern 235 in a section having a certain length (e.g., L) is folded around a virtual centerline, the centerline average height roughness may be defined as a value obtained by dividing an area, which is formed by the curve apart from the virtual centerline in the section, by the certain length L.

In a comparative example, a method of forming a redistribution line pattern may include chemically etching at least a portion of the redistribution line pattern. In this case, the centerline average height roughness of the surface of the redistribution line pattern may exceed about 0.5 micrometers.

According to an example embodiment, a method of forming the redistribution line pattern 235 may skip a stage of chemically etching at least a portion of the redistribution line pattern 235, and accordingly, the roughness of the upper surface 235_US of the redistribution line pattern 235 may be about 0.03 micrometers to about 0.09 micrometers.

According to an example embodiment, the lower portion 235L of the redistribution line pattern 235 may have a structure having a horizontal length increasing downwards, and accordingly, a contact area between the redistribution line pattern 235 and the insulating layer 210 may increase. As a result, the adhesion between the redistribution line pattern 235 and the insulating layer 210 may be enhanced, and delamination between the redistribution line pattern 235 and the insulating layer 210 may be decreased.

In addition, because the lower portion 235L of the redistribution line pattern 235 may have a structure having a horizontal length increasing downwards, the center of gravity of the redistribution line pattern 235 may be more adjacent to the lower portion 235L than to the upper portion 235U. Accordingly, the structural reliability of the redistribution line pattern 235 may be increased, and shifting of the redistribution line pattern 235 may be decreased.

According to an example embodiment, because the middle portion 235M of the redistribution line pattern 235 may have the side wall 235M_SS having a shape that is concave towards the virtual centerline C passing through the center of the redistribution line pattern 235 in the vertical direction, stress applied to the redistribution line pattern 235 may be dispersed, and accordingly, the structural reliability of the redistribution line pattern 235 may be increased.

In addition, because the upper portion 235U of the redistribution line pattern 235 may have the upper surface 235_US that is convex upwards, a contact area between the upper portion 235U and the insulating layer 210 may increase.

Moreover, the upper surface 235_US of the redistribution line pattern 235 may have a concave-convex structure in which concavities and convexities are repeated, and accordingly, the area of the redistribution line pattern 235 may be increased. Accordingly, a contact area between the redistribution line pattern 235 and the insulating layer 210 may be further increased.

Figure 3:
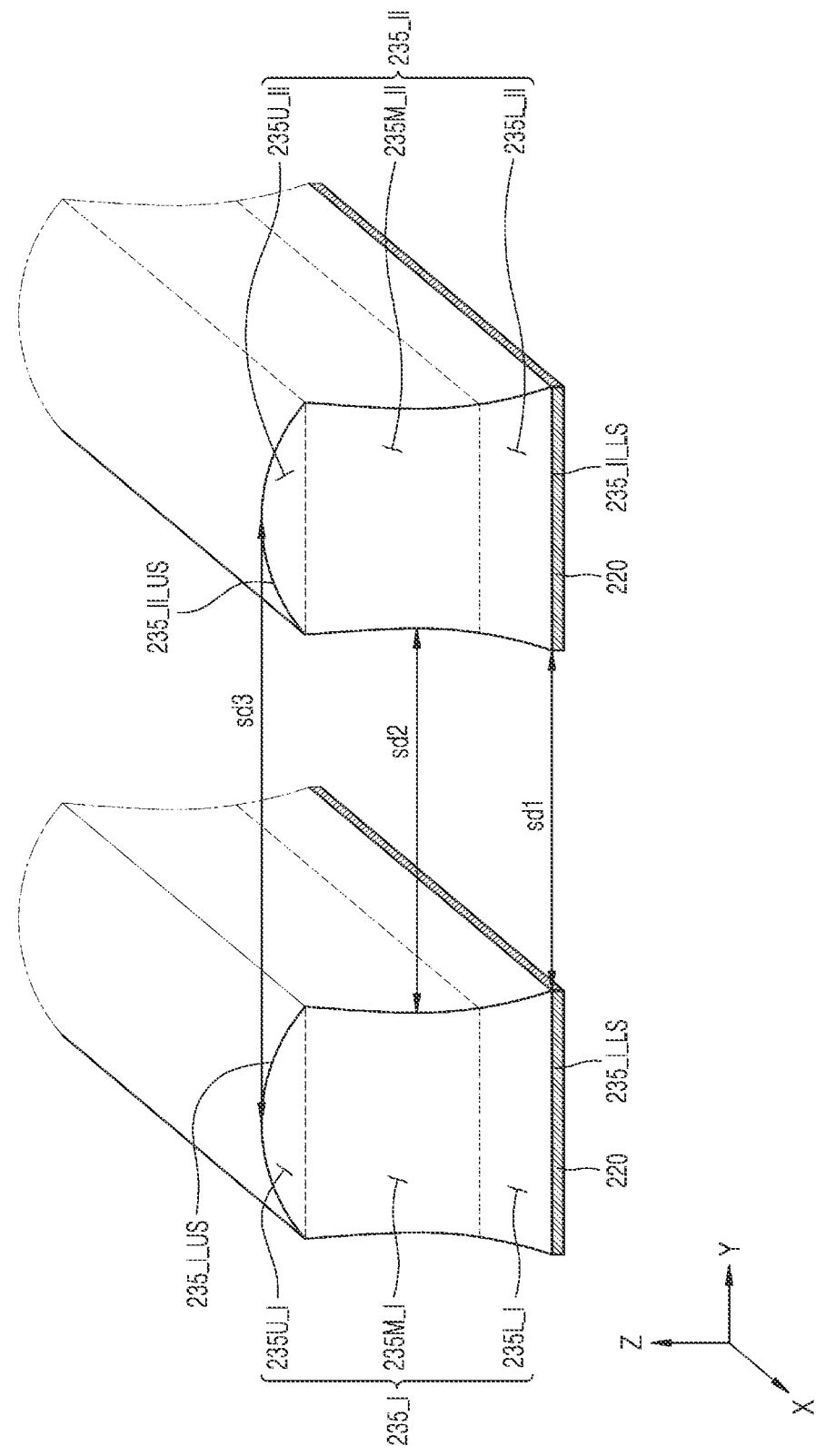
FIG. 3 illustrates a diagram of a plurality of redistribution line patterns according to embodiments of the inventive concepts.

FIG. 3 illustrates a diagram of a plurality of redistribution line patterns, e.g., first and second redistribution line patterns 235_I and 235_II, according to embodiments of the inventive concepts.

In an example embodiment, the first and second redistribution line patterns 235_I and 235_II may extend in an X direction. The first and second redistribution line patterns 235_I and 235_II may be separated from each other in the Y direction.

The first redistribution line pattern 235_I may include a first lower portion 235L_I, a first middle portion 235M_I, and a first upper portion 235U_I. The second redistribution line pattern 235_II may include a second lower portion 235L_II, a second middle portion 235M_II, and a second upper portion 235U_II.

In an example embodiment, a lower separation distance sd1 between the first lower portion 235L_I of the first redistribution line pattern 235_I and the second lower portion 235L_II of the second redistribution line pattern 235_II in the horizontal direction (e.g., the Y direction) may be about 3 micrometers to about 4 micrometers. The lower separation distance sd1 may correspond to a distance between a lower surface 235_I_LS of the first redistribution line pattern 235_I and a lower surface 235_II_LS of the second redistribution line pattern 235_II. The lower separation distance sd1 may correspond to the least (or smallest) distance among the distances between the first lower portion 235L_I of the first redistribution line pattern 235_I and the second lower portion 235L_II of the second redistribution line pattern 235_II in the horizontal direction (e.g., the Y direction).

In an example embodiment, the lower separation distance sd1 between the first redistribution line pattern 235_I and the second redistribution line pattern 235_II may be about 3.41 micrometers. However, the lower separation distance sd1 is not limited to the above mentioned distances.

In an example embodiment, a middle separation distance sd2 between the first middle portion 235M_I of the first redistribution line pattern 235_I and the second middle portion 235M_II of the second redistribution line pattern 235_II in the horizontal direction (e.g., the Y direction) may be greater than the lower separation distance sd1.

The middle separation distance sd2 may correspond to the greatest distance among the distances between the first middle portion 235M_I of the first redistribution line pattern 235_I and the second middle portion 235M_II of the second redistribution line pattern 235_II in the horizontal direction (e.g., the Y direction).

In an example embodiment, the middle separation distance sd2 may be about 3.3 micrometers to about 4.7 micrometers. In an example embodiment, the middle separation distance sd2 between the first redistribution line pattern 235_I and the second redistribution line pattern 235_II may be about 4.21 micrometers. However, the middle separation distance sd2 is not limited to the above mentioned distances.

In an example embodiment, an upper separation distance sd3 between the first upper portion 235U_I of the first redistribution line pattern 235_I and the second upper portion 235U_II of the second redistribution line pattern 235_II in the horizontal direction (e.g., the Y direction) may be about 4 micrometers to about 6 micrometers. The upper separation distance sd3 may correspond to a horizontal distance between the peak of an upper surface 235_I_US of the first redistribution line pattern 235_I and the peak of an upper surface 235_II US of the second redistribution line pattern 235_II.

The upper separation distance sd3 may correspond to the greatest distance among the distances between the first upper portion 235U_I of the first redistribution line pattern 235_I and the second upper portion 235U_II of the second redistribution line pattern 235_II in the horizontal direction (e.g., the Y direction).

In an example embodiment, the upper separation distance sd3 may be greater than the middle separation distance sd2. The upper separation distance sd3 may be greater than the lower separation distance sd1.

In an example embodiment, the upper separation distance sd3 between the first redistribution line pattern 235_I and the second redistribution line pattern 235_II may be about 4.5 micrometers. However, the upper separation distance sd3 is not limited to the above mentioned distances.

According to an example embodiment, the first middle portion 235M_I of the first redistribution line pattern 235_I and the second middle portion 235M_II of the second redistribution line pattern 235_II may each have a concave side wall, and accordingly, the middle separation distance sd2 may be greater than the lower separation distance sd1. As a result, the occurrence of an electrical short between the first and second redistribution line patterns 235_I and 235_II may be reduced.

According to an example embodiment, because the middle separation distance sd2 between the first and second redistribution line patterns 235_I and 235_II may be greater than the lower separation distance sd1 therebetween, electromigration may be improved.

Figure 4:
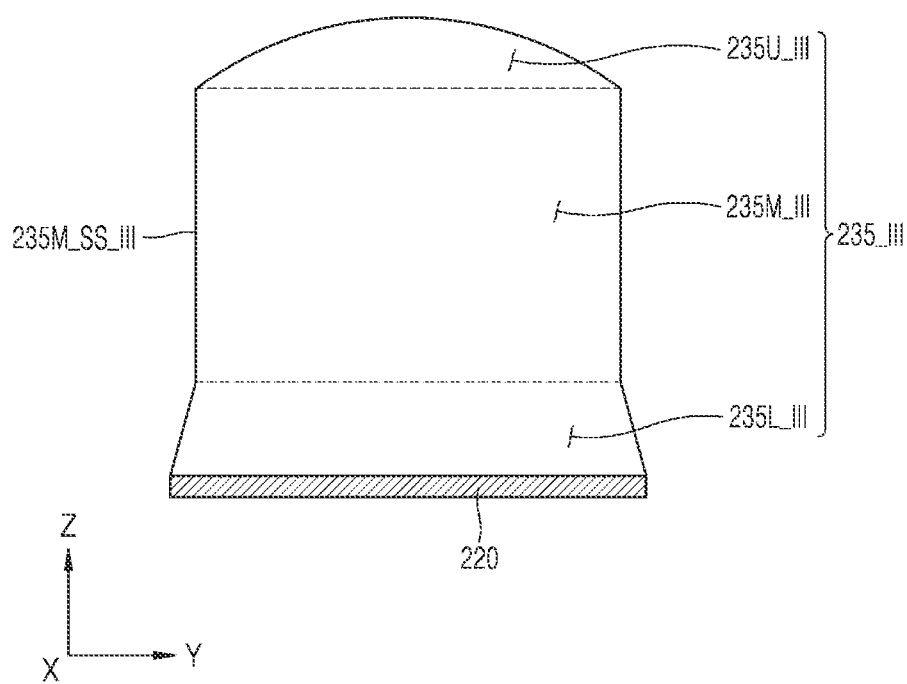
FIG. 4 illustrates a cross-sectional view of a redistribution line pattern according to embodiments of the inventive concepts.

FIG. 4 illustrates a cross-sectional view of a redistribution line pattern 235_III according to embodiments of the inventive concepts.

Hereinafter, description of the redistribution line pattern 235_III of FIG. 4 that is redundant to description of the redistribution line pattern 235 in FIG. 2 may hereinafter be omitted, and the following description of the redistribution line pattern 235_III of FIG. 4 will focus on differences with respect to the redistribution line pattern 235.

Referring to FIG. 4, the redistribution line pattern 235_III may include a lower portion 235L_III, a middle portion 235M_III, and an upper portion 235U_III.

The middle portion 235M_III of the redistribution line pattern 235_III may substantially have a uniform length in the horizontal direction (e.g., the Y direction) along the vertical direction (e.g., the Z direction). In other words, the cross-section of the middle portion 235M_III of the redistribution line pattern 235_III may have a rectangular shape. For example, in the cross-section of the middle portion 235M_III, a side wall 235M_SS_III of the middle portion 235M_III may have a straight line shape.

Hereinafter, a method S100 of manufacturing the semiconductor package 10 according to an example embodiment is described in detail. Specifically, the method S100 of manufacturing the semiconductor package 10 including the redistribution line pattern 235 described with reference to FIGS. 1 to 4 is described in detail below.

Figure 5:
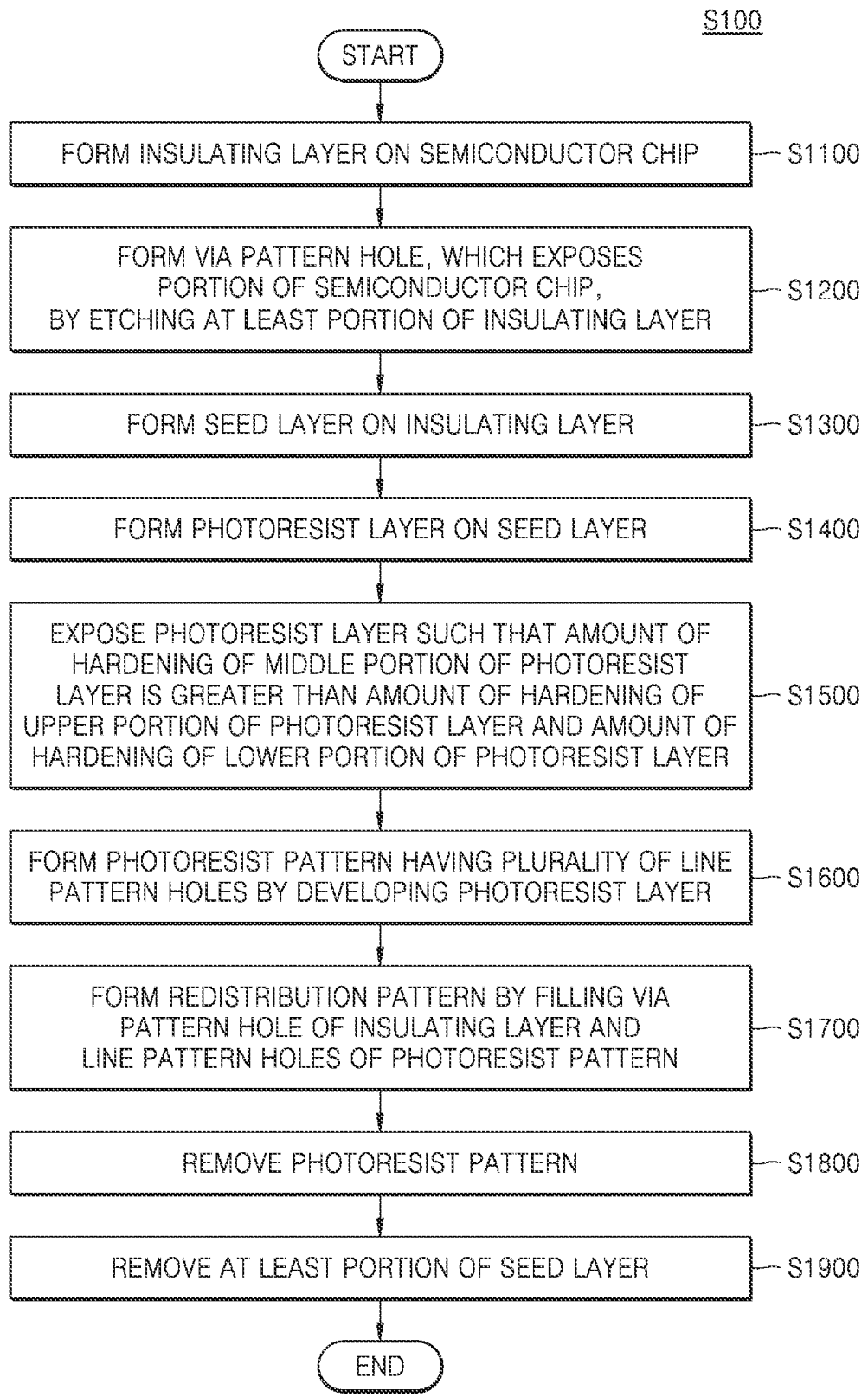
FIG. 5 illustrates a flowchart of a method of manufacturing a semiconductor package, according to embodiments of the inventive concepts.

FIG. 5 illustrates a flowchart of the method S100 of manufacturing the semiconductor package 10, according to embodiments of the inventive concepts. FIGS. 6 to 17 are diagrams of stages in the method S100 of manufacturing the semiconductor package 10, according to an example embodiment.

Referring to FIG. 5, the method S100 of manufacturing the semiconductor package 10 includes forming the insulating layer 210 on the semiconductor chip 100 in operation S1100; forming a via pattern hole (H_V in FIG. 7), which exposes a portion of the semiconductor chip 100, by etching at least a portion of the insulating layer 210 in operation S1200; forming the seed layer 220 on the insulating layer 210 in operation S1300; forming a photoresist layer (PR_L in FIG. 9) on the seed layer 220 in operation S1400; exposing the photoresist layer PR_L such that the amount of hardening of a middle portion of the photoresist layer PR_L is greater than the amount of hardening of the upper portion of the photoresist layer PR_L and the amount of hardening of the lower portion of the photoresist layer PR_L in operation S1500; forming a photoresist pattern (PR_P in FIG. 13) having a plurality of line pattern holes (H_L in FIG. 13) by developing the photoresist layer PR_L in operation S1600; forming the redistribution pattern 230 by filling the via pattern hole H_V of the insulating layer 210 and the line pattern holes H_L of the photoresist pattern PR_P in operation S1700; removing the photoresist pattern PR_P in operation S1800; and removing at least a portion of the seed layer 220 in operation S1900.

Figure 6:
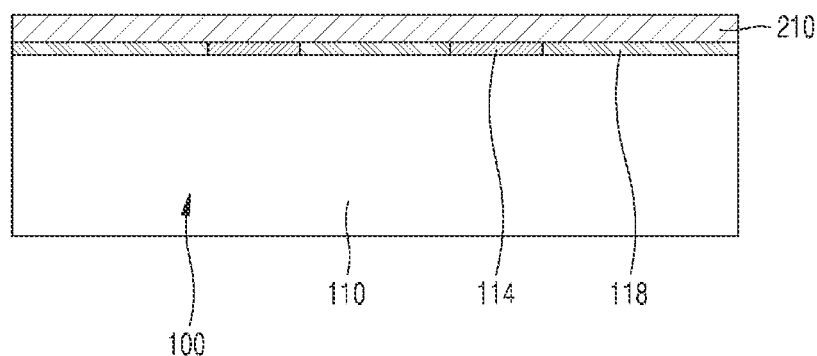
FIG. 6 illustrates a diagram of a stage of forming an insulating layer on a semiconductor chip, according to embodiments of the inventive concepts.

FIG. 6 illustrates a diagram of operation S1100 of forming the insulating layer 210 on the semiconductor chip 100, according to embodiments of the inventive concepts.

Referring to FIGS. 5 and 6, according to an example embodiment, the method S100 of manufacturing the semiconductor package 10 includes forming the insulating layer 210 on the semiconductor chip 100 in operation S1100.

In operation S1100, the insulating layer 210 may cover the chip pad 114 of the semiconductor chip 100. In detail, the semiconductor chip 100 may be conformally coated with the insulating layer 210 through spin coating.

In an example embodiment, the insulating layer 210 may include oxide or nitride. For example, the insulating layer 210 may include silicon oxide or silicon nitride.

Figure 7:
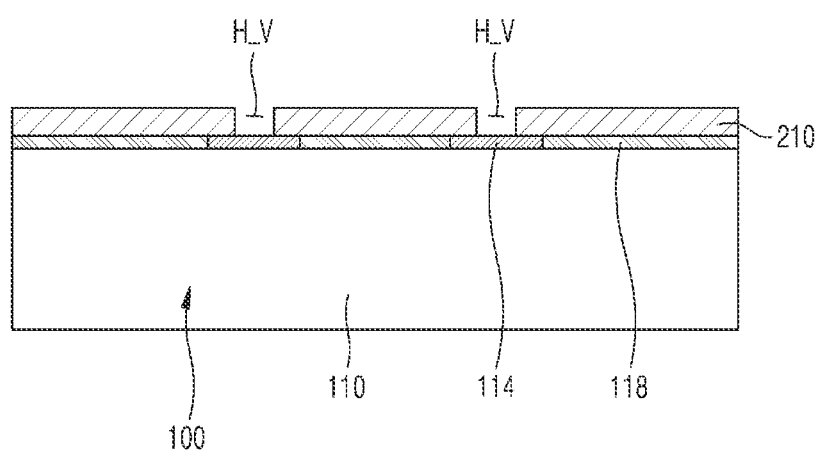
FIG. 7 illustrates a diagram of a stage of forming a via pattern hole by etching at least a portion of the insulating layer, according to embodiments of the inventive concepts.

FIG. 7 illustrates a diagram of operation S1200 of forming the via pattern hole H_V by etching at least a portion of the insulating layer 210, according to embodiments of the inventive concepts.

Referring to FIGS. 5 and 7, according to an example embodiment, the method S100 of manufacturing the semiconductor package 10 includes forming the via pattern hole H_V, which exposes a portion of the semiconductor chip 100, by etching at least a portion of the insulating layer 210 in operation S1200.

In operation S1200, the insulating layer 210 may be at least partially etched such that the chip pad 114 of the semiconductor chip 100 is exposed. In an example embodiment, a portion of the insulating layer 210, which overlaps with the chip pad 114 in the vertical direction, may be etched in operation S1200.

In an example embodiment, the via pattern hole H_V exposing the chip pad 114 may be usually formed using a photolithography process or an etching process. However, embodiments are not limited to using a photolithography process or an etching process, and the via pattern hole H_V may be formed using a laser drilling process.

Figure 8:
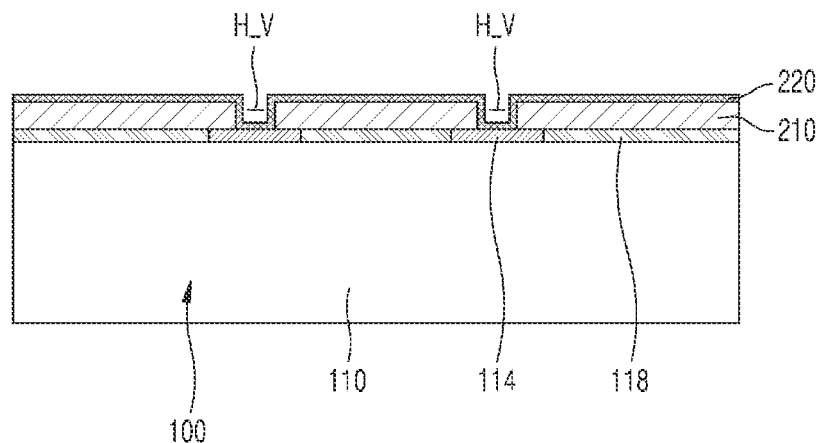
FIG. 8 illustrates a diagram of a stage of forming a seed layer on the insulating layer, according to embodiments of the inventive concepts.

FIG. 8 illustrates a diagram of operation S1300 of forming the seed layer 220 on the insulating layer 210, according to embodiments of the inventive concepts.

Referring to FIGS. 5 and 8, according to an example embodiment, the method S100 of manufacturing the semiconductor package 10 includes forming the seed layer 220 on the insulating layer 210 in operation S1300.

In operation S1300, the seed layer 220 may be conformally formed on a surface of the insulating layer 210. In an example embodiment, the seed layer 220 may be formed on the surface of the insulating layer 210 using a physical vapor deposition process.

In an example embodiment, operation S1300 may include conformally forming a first seed layer on the surface of the insulating layer 210 and conformally forming a second seed layer on a surface of the first seed layer. In this case, the material of the first seed layer may be different from the material of the second seed layer.

In an example embodiment, the seed layer 220 may include a plurality of layers. For example, the seed layer 220 may have a structure in which Cu is stacked on Ti or TiW. However, the material of the seed layer 220 is not limited to the above mentioned materials.

Figure 9:
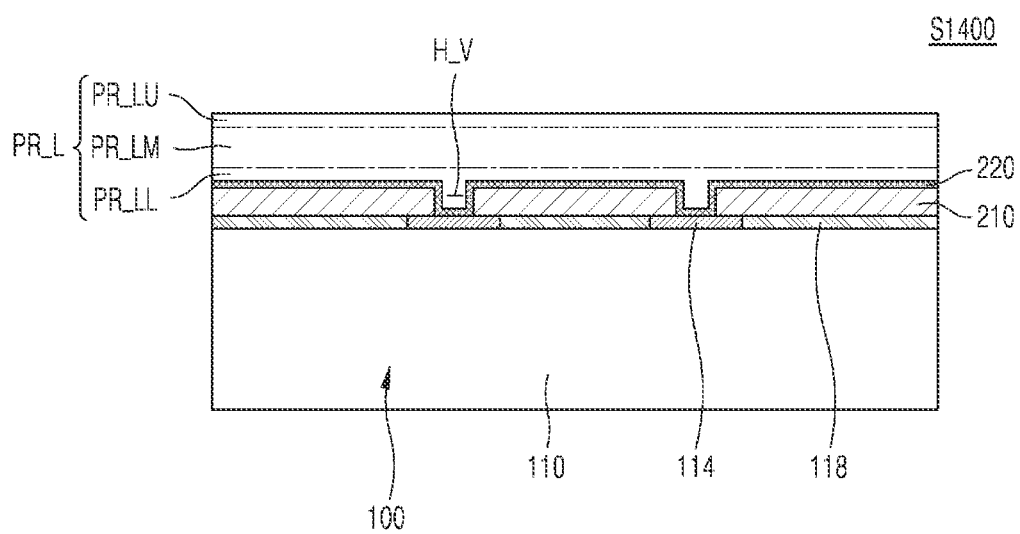
FIG. 9 illustrates a diagram of a stage of forming a photoresist layer on the seed layer, according to embodiments of the inventive concepts.

FIG. 9 illustrates a diagram of operation S1400 of forming the photoresist layer PR_L on the seed layer 220, according to embodiments of the inventive concepts.

Referring to FIGS. 5 and 9, according to an example embodiment, the method S100 of manufacturing the semiconductor package 10 includes forming the photoresist layer PR_L on the seed layer 220 in operation S1400.

In an example embodiment, the photoresist layer PR_L may include a positive photoresist of which the exposed region is removed during a photolithography process. In other words, a portion of the photoresist layer PR_L which is exposed during a photolithography process may be removed during a development process, and an unexposed portion of the photoresist layer PR_L is not removed during the development process.

In operation S1400, the photoresist layer PR_L may be deposited on the insulating layer 210 as having a uniform thickness using a spin coating process. The photoresist layer PR_L may fill the via pattern hole H_V of the insulating layer 210.

In an example embodiment, the photoresist layer PR_L may include a lower portion PR_LL, a middle portion PR_LM, and an upper portion PR_LU, which are sequentially stacked.

Figure 10:
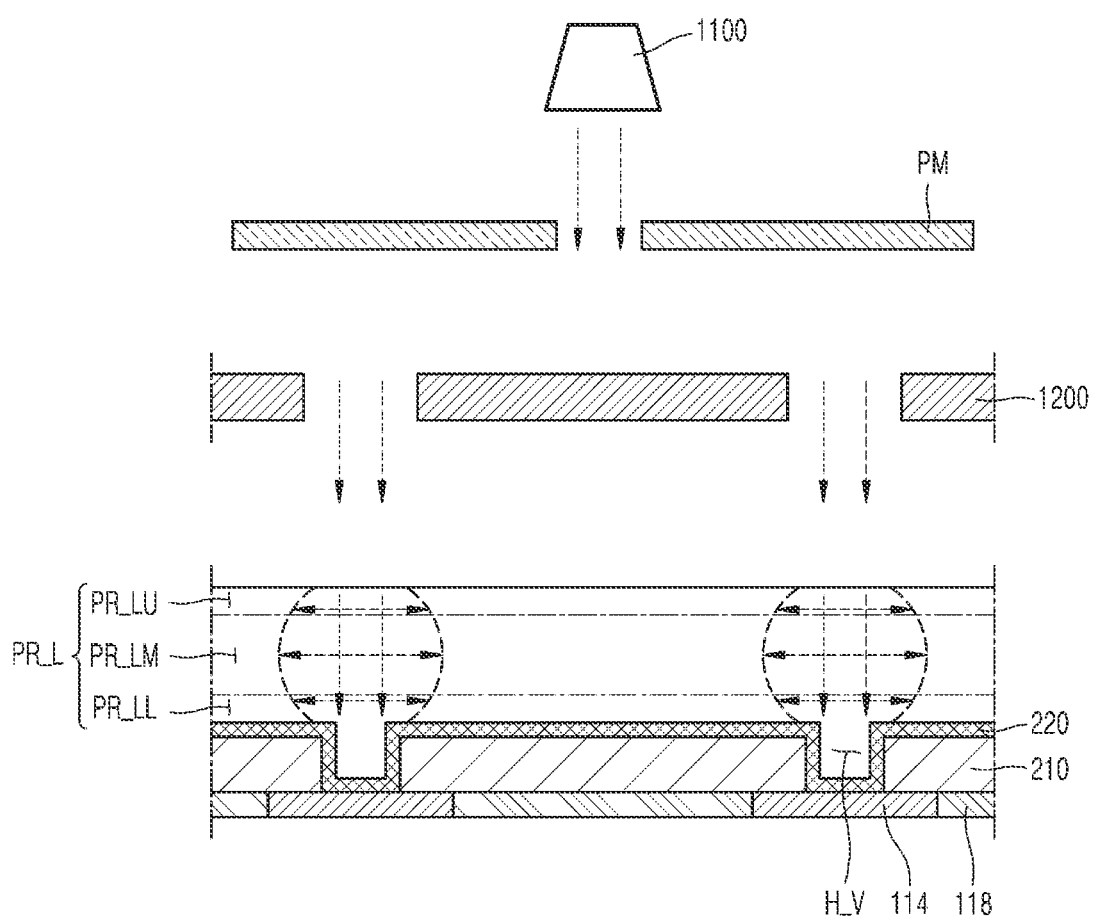
FIG. 10 illustrates a diagram of a stage of exposing the photoresist layer, according to embodiments of the inventive concepts.

FIG. 10 illustrates a diagram of operation S1500 of exposing the photoresist layer PR_L, according to embodiments of the inventive concepts.

Referring to FIGS. 5 and 10, according to an example embodiment, the method S100 of manufacturing the semiconductor package 10 includes exposing the photoresist layer PR_L such that the amount of hardening of the middle portion PR_LM of the photoresist layer PR_L is greater than the amount of hardening of the upper portion PR_LU of the photoresist layer PR_L and the amount of hardening of the lower portion PR_LL of the photoresist layer PR_L in operation S1500.

The photoresist layer PR_L may include the lower portion PR_LL, the middle portion PR_LM, and the upper portion PR_LU. The lower portion PR_LL of the photoresist layer PR_L may correspond to a portion of the photoresist layer PR_L for forming a lower portion (235L in FIG. 15) of the redistribution line pattern 235. The middle portion PR_LM of the photoresist layer PR_L may correspond to a portion of the photoresist layer PR_L for forming a middle portion (235M in FIG. 15) of the redistribution line pattern 235. The upper portion PR_LU of the photoresist layer PR_L may correspond to a portion of the photoresist layer PR_L for forming an upper portion (235U in FIG. 15) of the redistribution line pattern 235.

In an example embodiment, the thicknesses of each of the lower, middle, and upper portions PR_LL, PR_LM, and PR_LU of the photoresist layer PR_L may be about ⅓ of the total thickness of the photoresist layer PR_L. However, the thicknesses of each of the lower, middle, and upper portions PR_LL, PR_LM, and PR_LU of the photoresist layer PR_L are not limited thereto.

In operation S1500, at least a portion of a surface of the photoresist layer PR_L may be exposed by a photomask PM and hardened by light from a light source 1100 that reaches the photoresist layer PR_L sequentially through the photomask PM and a lens 1200.

In this case, the photoresist layer PR_L may be exposed such that the amount of hardening of the middle portion PR_LM of the photoresist layer PR_L is greater than the amount of hardening of the upper portion PR_LU of the photoresist layer PR_L and the amount of hardening of the lower portion PR_LL of the photoresist layer PR_L.

In an example embodiment, the amount of light reaching the middle portion PR_LM of the photoresist layer PR_L may be greater than the amount of light reaching the upper portion PR_LU of the photoresist layer PR_L in operation S1500. In addition, the amount of light reaching the middle portion PR_LM of the photoresist layer PR_L may be greater than the amount of light reaching the lower portion PR_LL of the photoresist layer PR_L in operation S1500.

In an example embodiment, a diffraction radius of light reaching the middle portion PR_LM of the photoresist layer PR_L may be greater than a diffraction radius of light reaching the upper portion PR_LU of the photoresist layer PR_L in operation S1500. In addition, the diffraction radius of light reaching the middle portion PR_LM of the photoresist layer PR_L may be greater than a diffraction radius of light reaching the lower portion PR_LL of the photoresist layer PR_L in operation S1500.

The diffraction radius of light may be defined as a distance, by which light incident to the photoresist layer PR_L is diffracted in the horizontal direction in the photoresist layer PR_L.

In an example embodiment, to control the amount of hardening of the middle portion PR_LM of the photoresist layer PR_L, the shift of the light source 1100 in the vertical direction (e.g., the Z direction) may be controlled in operation S1500. In other words, the focus of light from the light source 1100 may be controlled.

Figure 11:
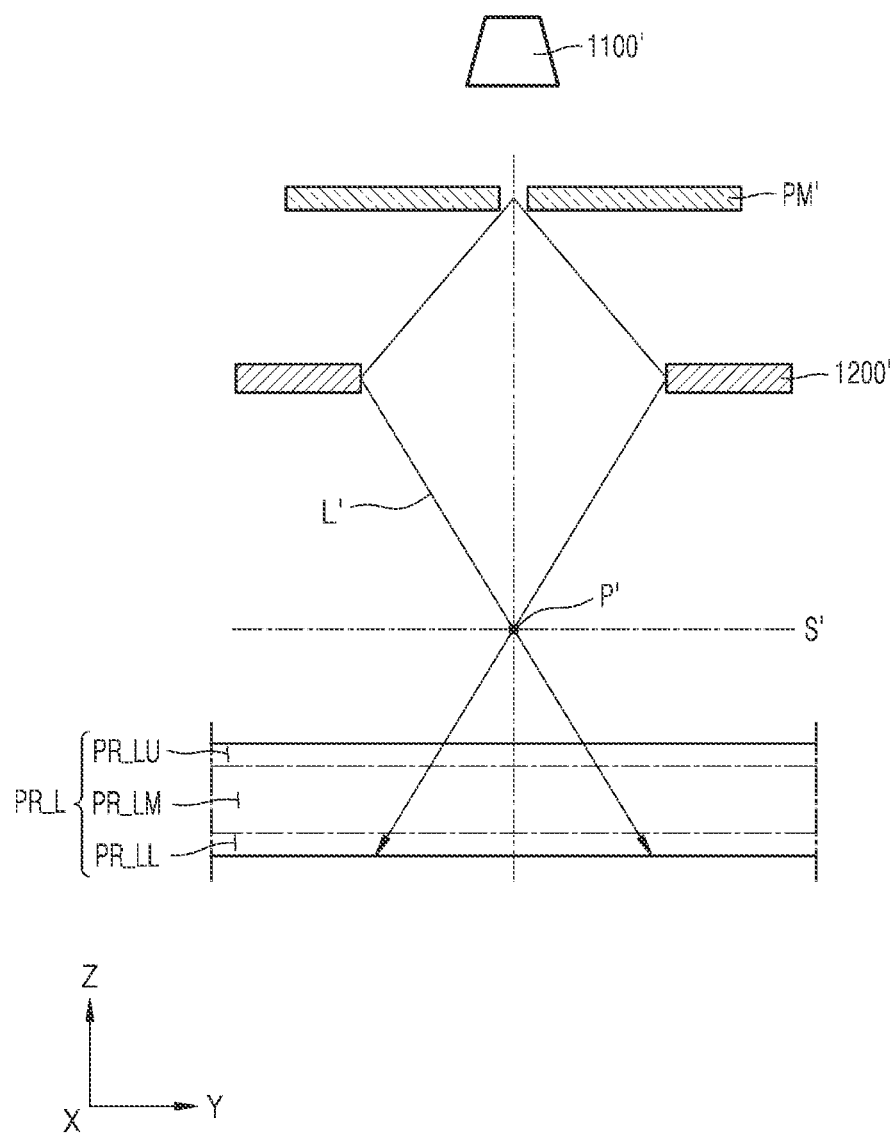
FIG. 11 illustrates a diagram of a stage of exposing a photoresist layer, according to a comparative example.

FIG. 11 illustrates a diagram of a stage of exposing the photoresist layer PR_L, according to a comparative example.

Referring to FIG. 11, light L' provided from a light source 1100' may pass through a photomask PM' and a lens 1200' and reach the photoresist layer PR_L. The light L' may uniformly harden the middle, upper, and lower portions PR_LM, PR_LU, and PR_LL of the photoresist layer PR_L.

In other words, the amount of light L' reaching the middle portion PR_LM of the photoresist layer PR_L may be substantially equal to the amount of light L' reaching the upper portion PR_LU of the photoresist layer PR_L and the amount of light L' reaching the lower portion PR_LL of the photoresist layer PR_L. In addition, the diffraction radius of the light L' reaching the middle portion PR_LM of the photoresist layer PR_L may be substantially the same as the diffraction radius of the light L' reaching the upper portion PR_LU of the photoresist layer PR_L and the diffraction radius of the light L' reaching the lower portion PR_LL of the photoresist layer PR_L.

A plane, in which a focus P' of the light L' is located when the light L' uniformly hardens the middle, upper, and lower portions PR_LM, PR_LU, and PR_LL of the photoresist layer PR_L, may be defined as a reference plane S'. In other words, when the focus P' of the light L' from the light source 1100' is in the reference plane S', the middle, upper, and lower portions PR_LM, PR_LU, and PR_LL of the photoresist layer PR_L may be uniformly hardened.

Figure 12:
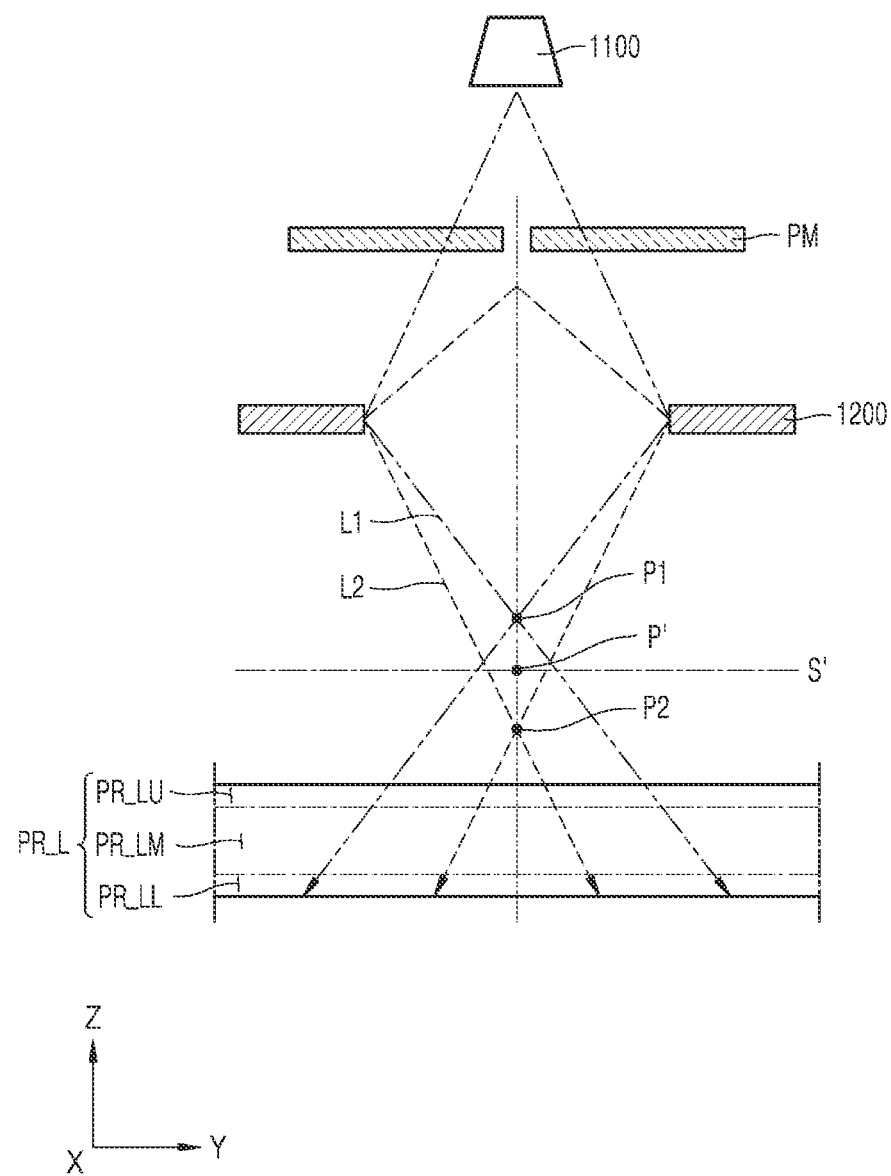
FIG. 12 illustrates a diagram of a stage of exposing a photoresist layer, according to embodiments of the inventive concepts.

FIG. 12 illustrates a diagram of a stage of exposing the photoresist layer PR_L, according to embodiments of the inventive concepts.

Referring to FIG. 12, first light L1 and second light L2 provided from the light source 1100 may expose the photoresist layer PR_L such that the amount of hardening of the middle portion PR_LM of the photoresist layer PR_L is greater than the amount of hardening of the upper portion PR_LU of the photoresist layer PR_L and the amount of hardening of the lower portion PR_LL of the photoresist layer PR_L.

In an example embodiment, a focus P1 of the first light L1 and a focus P2 of the second light L2 may have an offset from the reference plane S', which is described with reference to FIG. 11, in the vertical direction (e.g., the Z direction). The focus P1 of the first light L1 may be above the reference plane S'. In other words, the focus P1 of the first light L1 may have an offset from the reference plane S' in a +Z direction. The focus P2 of the second light L2 may be below the reference plane S'. In other words, the focus P2 of the second light L2 may have an offset from the reference plane S' in the −Z direction.

In an example embodiment, the position of the focus P1 of the first light L1 and the position of the focus P2 of the second light L2 may be controlled by shifting the light source 1100 in the vertical direction (the Z direction).

In an example embodiment, because each of the focuses P1 and P2 of the first light L1 and second light L2 from the light source 1100 may have an offset from the reference plane S' in the vertical direction (the Z direction), the amount of first light L1 and second light L2 reaching the middle portion PR_LM of the photoresist layer PR_L may be greater than the amount of first light L1 and second light L2 reaching the upper portion PR_LU of the photoresist layer PR_L and the amount of first light L1 and second light L2 reaching the lower portion PR_LL of the photoresist layer PR_L.

In addition, because each of the focuses P1 and P2 of the first light L1 and second light L2 from the light source 1100 may have an offset from the reference plane S' in the vertical direction (the Z direction), the diffraction radius of the first light L1 and second light L2 reaching the middle portion PR_LM of the photoresist layer PR_L may be greater than the diffraction radius of the first light L1 and second light L2 reaching the upper portion PR_LU of the photoresist layer PR_L and the diffraction radius of the first light L1 and second light L2 reaching the lower portion PR_LL of the photoresist layer PR_L.

Accordingly, the amount of hardening of the middle portion PR_LM of the photoresist layer PR_L may be greater than the amount of hardening of the upper portion PR_LU of the photoresist layer PR_L and the amount of hardening of the lower portion PR_LL of the photoresist layer PR_L.

Figure 13:
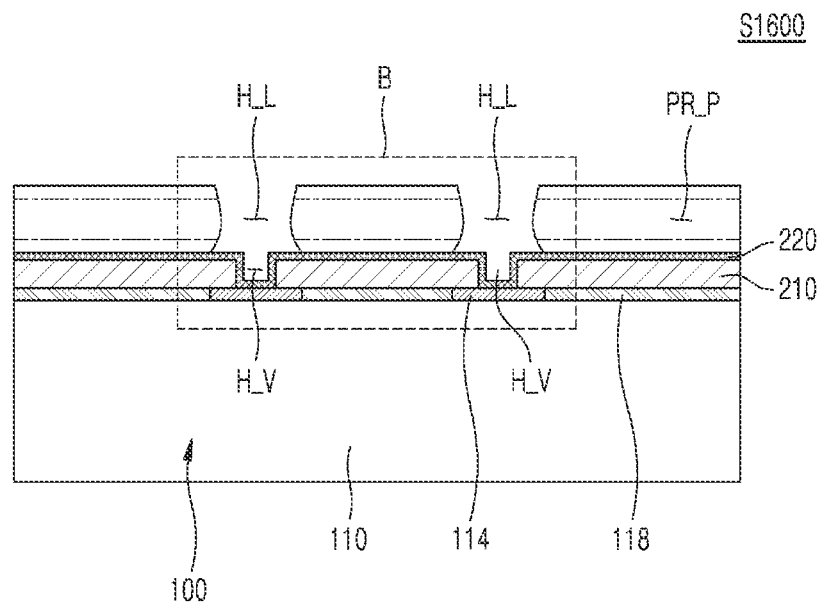
FIG. 13 illustrates a diagram of a stage of developing the photoresist layer, according to embodiments of the inventive concepts.
Figure 14:
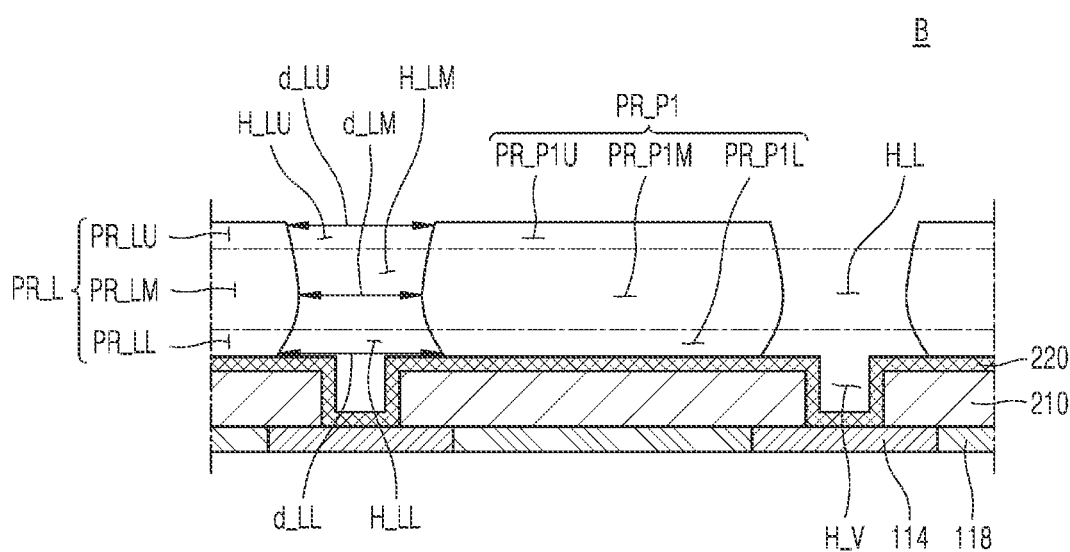
FIG. 14 illustrates an enlarged view of region B of FIG. 13.

FIG. 13 illustrates a diagram of operation S1600 of a stage of developing the photoresist layer PR_L, according to embodiments of the inventive concepts. FIG. 14 illustrates an enlarged view of region B in FIG. 13.

Referring to FIGS. 5, 13, and 14, according to an example embodiment, the method S100 of manufacturing the semiconductor package 10 includes forming the photoresist pattern PR_P having the line pattern holes H_L by developing the photoresist layer PR_L in operation S1600.

The portion of the photoresist layer PR_L exposed by the photolithography process may be removed by a development process in operation S1600. For example, a developer may be provided to the photoresist layer PR_L and may remove hardened portions of the photoresist layer PR_L. Accordingly, the photoresist pattern PR_P having the line pattern holes H_L may be formed.

In an example embodiment, each of the line pattern holes H_L of the photoresist layer PR_L may overlap in the vertical direction with the via pattern hole V_H of the insulating layer 210.

As described above, because the amount of hardening of the middle portion PR_LM of the photoresist layer PR_L may be greater than the amount of hardening of the upper portion PR_LU of the photoresist layer PR_L and the amount of hardening of the lower portion PR_LL of the photoresist layer PR_L, a removal amount of the photoresist layer PR_L during the development process may be less in the middle portion PR_LM than in the upper portion PR_LU and the lower portion PR_LL.

In an example embodiment, a length d_LM of a middle portion H_LM of a line pattern hole H_L may be less than a length d_LU of an upper portion H_LU of the line pattern hole H_L. The length d_LM of the middle portion H_LM of the line pattern hole H_L may be less than a length d_LL of a lower portion H_LL of the line pattern hole H_L.

In other words, a first photoresist pattern PR_P1 between two adjacent line pattern holes H_L may include an upper portion PR_P1U, a middle portion PR_P1M, and a lower portion PR_P1L.

In an example embodiment, a horizontal length of the middle portion PR_P1M of the first photoresist pattern PR_P1 may be greater than a horizontal length of the upper portion PR_P1U of the upper portion PR_P1U and a horizontal length of the lower portion PR_P1L of the first photoresist pattern PR_P1.

In an example embodiment, the flow rate of a developer provided to develop the photoresist layer PR_L may also be controlled in operation S1600.

In an example embodiment, operation S1600 may include forming the upper portion H_LU of the line pattern hole H_L by providing a developer to the upper portion PR_LU (in FIG. 10) of the photoresist layer PR_L (in FIG. 10) at a first flow rate, forming the middle portion H_LM of the line pattern hole H_L by providing the developer to the middle portion PR_LM (in FIG. 10) of the photoresist layer PR_L at a second flow rate that is less than the first flow rate, and forming the lower portion H_LL of the line pattern hole H_L by providing the developer to the lower portion PR_LL (in FIG. 10) of the photoresist layer PR_L at a third flow rate.

The second flow rate of a developer for removing the middle portion PR_LM of the photoresist layer PR_L may be less than the first flow rate of a developer for removing the upper portion PR_LU of the photoresist layer PR_L, and accordingly, a removal amount of the middle portion PR_LM of the photoresist layer PR_L by the developer may be less than a removal amount of the upper portion PR_LU of the photoresist layer PR_L by the developer.

In an example embodiment, the third flow rate of a developer for removing the lower portion PR_LL of the photoresist layer PR_L may be substantially equal to the second flow rate of a developer for removing the middle portion PR_LM of the photoresist layer PR_L. In this case, the amount of hardening of the lower portion PR_LL of the photoresist layer PR_L may be less than the amount of hardening of the middle portion PR_LM of the photoresist layer PR_L, and accordingly, a removal amount of the lower portion PR_LL of the photoresist layer PR_L may be greater than a removal amount of the middle portion PR_LM of the photoresist layer PR_L.

Figure 15:
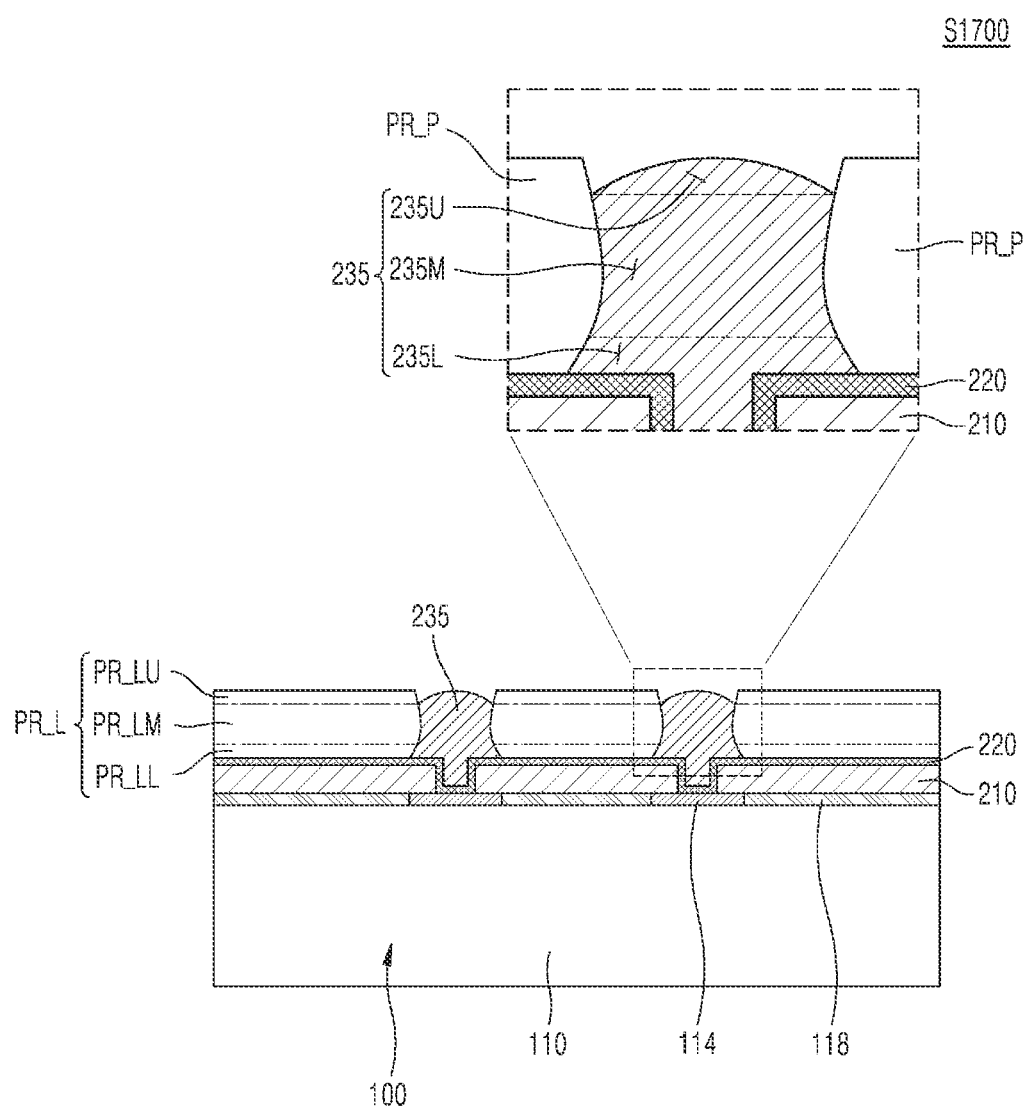
FIG. 15 illustrates a diagram of a stage of forming a redistribution pattern, according to embodiments of the inventive concepts.

FIG. 15 illustrates a diagram of operation S1700 of forming the redistribution pattern 230, according to embodiments of the inventive concepts.

Referring to FIGS. 5 and 15, according to an example embodiment, the method S100 of manufacturing the semiconductor package 10 includes forming the redistribution pattern 230 by filling a plurality of via pattern holes H_V of the insulating layer 210 and a plurality of line pattern holes H_L of the photoresist pattern PR_P in operation S1700.

In an example embodiment, operation S1700 may include forming a redistribution via pattern 233 (see FIG. 1) by filling a via pattern hole H_V of the insulating layer 210, and forming a redistribution line pattern 235 by filling a line pattern hole H_L of the photoresist pattern PR_P.

In an example embodiment, the forming of the redistribution line pattern 235 may include performing a plating process using at least a portion of the seed layer 220, which is exposed by the photoresist pattern PR_P.

As described above with reference to FIGS. 2 and 3, the redistribution line pattern 235 formed in operation S1700 may include the lower portion 235L, the middle portion 235M, and an upper portion 235U.

According to an example embodiment, the lower portion 235L of the redistribution line pattern 235 may have a structure having a horizontal length increasing downwards, and accordingly, a contact area between the redistribution line pattern 235 and the insulating layer 210 may increase. As a result, the adhesion between the redistribution line pattern 235 and the insulating layer 210 may be enhanced, and delamination between the redistribution line pattern 235 and the insulating layer 210 may be decreased.

In addition, because the lower portion 235L of the redistribution line pattern 235 may have a structure having a horizontal length increasing downwards, the center of gravity of the redistribution line pattern 235 may be more adjacent to the lower portion 235L than to the upper portion 235U. Accordingly, the structural reliability of the redistribution line pattern 235 may be increased, and the shift of the redistribution line pattern 235 may be decreased.

According to an example embodiment, because the middle portion 235M of the redistribution line pattern 235 may have the side wall 235M_SS having the shape that is concave towards the virtual centerline C passing through the center of the redistribution line pattern 235 in the vertical direction, stress applied to the redistribution line pattern 235 may be dispersed, and accordingly, the structural reliability of the redistribution line pattern 235 may be increased.

In addition, because the upper portion 235U of the redistribution line pattern 235 may have the upper surface 235_US that is convex upwards, a contact area between the upper portion 235U and the insulating layer 210 may increase.

Moreover, the upper surface 235_US (see FIG. 2) of the redistribution line pattern 235 may have the concave-convex structure in which concavities and convexities are repeated, and accordingly, the area of the redistribution line pattern 235 may be increased. Accordingly, a contact area between the redistribution line pattern 235 and the insulating layer 210 may be further increased.

Figure 16:
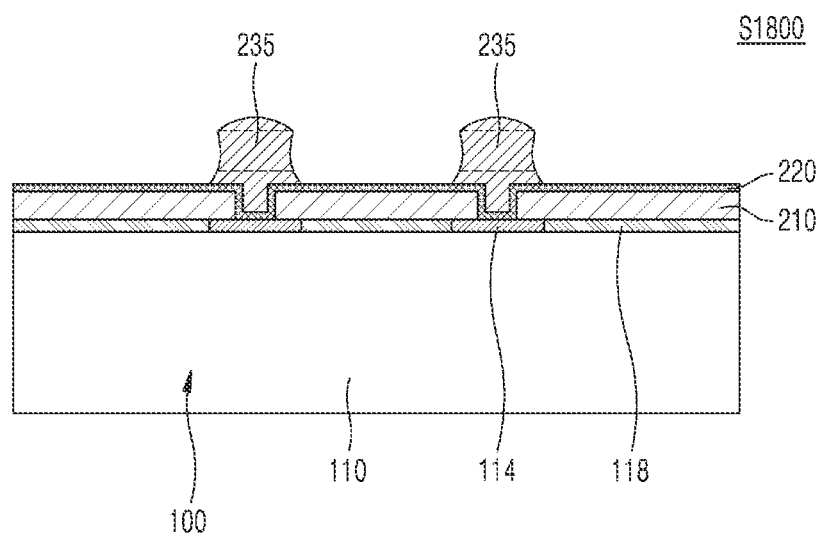
FIG. 16 illustrates a diagram of a stage of removing a photoresist pattern, according to embodiments of the inventive concepts.

FIG. 16 illustrates a diagram of operation S1800 of removing the photoresist pattern PR_P, according to embodiments of the inventive concepts.

Referring to FIGS. 5 and 16, according to an example embodiment, the method S100 of manufacturing the semiconductor package 10 includes removing the photoresist pattern PR_P in operation S1800.

In an example embodiment, the photoresist pattern PR_P may be removed by an ashing process and a stripping process. However, the method of removing the photoresist pattern PR_P is not limited to ashing and stripping.

Figure 17:
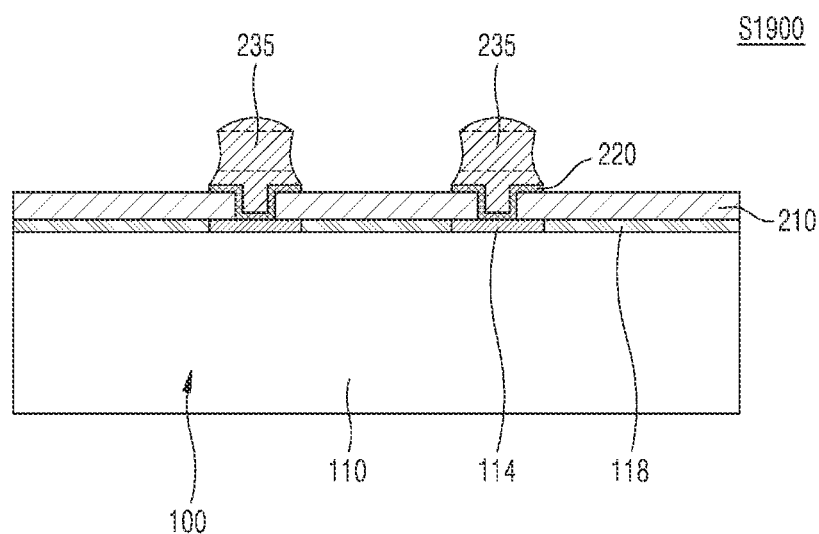
FIG. 17 illustrates a diagram of a stage of removing at least a portion of the seed layer, according to embodiments of the inventive concepts.

FIG. 17 illustrates a diagram of operation S1900 of removing at least a portion of the seed layer 220, according to embodiments of the inventive concepts.

Referring to FIGS. 5 and 17, according to an example embodiment, the method S100 of manufacturing the semiconductor package 10 includes removing at least a portion of the seed layer 220 in operation S1900.

A portion of the seed layer 220 which does not vertically overlap with the redistribution pattern 230 may be removed in operation S1900. In other words, the seed layer 220 that vertically overlaps with the redistribution pattern 230 may not be removed.

While the inventive concepts have been particularly shown and described with reference to embodiments thereof, it should be understood that various changes in form and detail may be made therein without departing from the spirit and scope of the following claims.

What is claimed is:

1. A method of manufacturing a semiconductor package, the method comprising:
    forming an insulating layer on a semiconductor chip;
    forming a via pattern hole in the insulating layer by etching at least a portion of the insulating layer, the via pattern hole exposing at least a portion of the semiconductor chip;
    forming a seed layer on the insulating layer and on the portion of the semiconductor chip exposed in the via pattern hole;
    forming a photoresist layer on the seed layer;
    exposing the photoresist layer such that an amount of hardening of a middle portion of the photoresist layer is greater than an amount of hardening of an upper portion of the photoresist layer and an amount of hardening of a lower portion of the photoresist layer;
    forming a photoresist pattern having a plurality of line pattern holes by developing the photoresist layer; and
    forming a redistribution pattern by filling the via pattern hole of the insulating layer and the plurality of line pattern holes of the photoresist pattern.

2. The method of claim 1, further comprising:
    removing the photoresist pattern; and
    removing a portion of the seed layer, wherein the portion of the seed layer does not overlap with the redistribution pattern in a vertical direction.

3. The method of claim 1, wherein the exposing of the photoresist layer comprises controlling a position of a focus of light such that an amount of light reaching the middle portion of the photoresist layer is greater than an amount of light reaching the upper portion of the photoresist layer and an amount of light reaching the lower portion of the photoresist layer.

4. The method of claim 1, wherein the exposing of the photoresist layer comprises controlling a position of a focus of light such that a diffraction radius of light reaching the middle portion of the photoresist layer is greater than a diffraction radius of light reaching the upper portion of the photoresist layer and a diffraction radius of light reaching the lower portion of the photoresist layer.

5. The method of claim 1, wherein the exposing of the photoresist layer comprises controlling a vertical shift of a light source providing light to the photoresist layer.

6. The method of claim 1, wherein the forming of the photoresist pattern having the plurality of line pattern holes comprises forming the photoresist pattern such that a horizontal length of a middle portion of each of the plurality of line pattern holes is less than a horizontal length of an upper portion of each of the plurality of line pattern holes and a horizontal length of a lower portion of each of the plurality of line pattern holes.

7. The method of claim 1, wherein the forming of the via pattern hole comprises forming a plurality of via pattern holes including the via pattern hole, and the forming of the photoresist pattern having the plurality of line pattern holes comprises forming the plurality of line pattern holes in portions of the photoresist layer, the portions of the photoresist layer respectively vertically overlapping with the plurality of via pattern holes of the insulating layer.

8. The method of claim 1, wherein the forming of the photoresist pattern having the plurality of line pattern holes comprises forming the photoresist pattern such that a horizontal length of a middle portion of a first photoresist pattern between the plurality of line pattern holes is greater than a horizontal length of an upper portion of the first photoresist pattern and a horizontal length of a lower portion of the first photoresist pattern.

9. The method of claim 1, wherein the forming of the seed layer comprises:
   conformally forming a first seed layer on a surface of the insulating layer and on the portion of the semiconductor chip exposed in the via pattern hole; and
   conformally forming a second seed layer on a surface of the first seed layer.

10. The method of claim 1, wherein the forming of the photoresist pattern comprises:
   forming an upper portion of each of the plurality of line pattern holes by providing a developer to the photoresist layer at a first flow rate;
   forming a middle portion of each of the plurality of line pattern holes by providing the developer to the photoresist layer at a second flow rate that is less than the first flow rate; and
   forming a lower portion of each of the plurality of line pattern holes by providing the developer to the photoresist layer at a third flow rate.

* * * * *